(12) United States Patent
Hölzle

(10) Patent No.: US 7,428,287 B2
(45) Date of Patent: Sep. 23, 2008

(54) METHOD AND DEVICE FOR SYNCHRONIZING DATA TRANSMISSION BETWEEN TWO CIRCUITS

(75) Inventor: Josef Hölzle, Bad Wörishofen (DE)

(73) Assignee: Infineon Technologies AG, Munich (DE)

( * ) Notice: Subject to any disclaimer, the term of this patent is extended or adjusted under 35 U.S.C. 154(b) by 728 days.

(21) Appl. No.: 10/491,947

(22) PCT Filed: Aug. 26, 2002

(86) PCT No.: PCT/EP02/09508

§ 371 (c)(1),
(2), (4) Date: Apr. 27, 2004

(87) PCT Pub. No.: WO03/032568

PCT Pub. Date: Apr. 17, 2003

(65) Prior Publication Data

US 2004/0247065 A1  Dec. 9, 2004

(30) Foreign Application Priority Data

Oct. 8, 2001  (DE) ................. 101 49 512

(51) Int. Cl.
*H04L 7/00* (2006.01)
*H03D 3/24* (2006.01)

(52) U.S. Cl. ..................... 375/372; 375/376
(58) Field of Classification Search .......... 375/354, 375/371–376
See application file for complete search history.

(56) References Cited

U.S. PATENT DOCUMENTS

| | | | |
|---|---|---|---|
| 4,827,490 A * | 5/1989 | Guerin ................. 375/362 |
| 5,572,557 A | 11/1996 | Aoki | |
| 5,764,709 A * | 6/1998 | Whiteside ............. 375/375 |
| 5,875,219 A | 2/1999 | Kim | |
| 5,905,391 A | 5/1999 | Mooney | |
| 5,949,262 A | 9/1999 | Dreps et al. | |
| 5,955,904 A * | 9/1999 | Kawasaki ............. 327/156 |
| 6,005,426 A * | 12/1999 | Lin et al. ............. 327/158 |
| 6,072,846 A | 6/2000 | Kyung et al. | |
| 6,194,930 B1 * | 2/2001 | Matsuzaki et al. ..... 327/156 |
| 6,215,720 B1 * | 4/2001 | Amano et al. ....... 365/230.03 |
| 6,225,840 B1 * | 5/2001 | Ishimi ................. 327/116 |
| 6,242,954 B1 | 6/2001 | Taniguchi et al. | |
| 6,346,839 B1 * | 2/2002 | Mnich ................. 327/158 |
| 6,959,062 B1 * | 10/2005 | Stubbs ................. 375/376 |
| 2001/0028599 A1 * | 10/2001 | Aikawa ................. 365/233 |

(Continued)

FOREIGN PATENT DOCUMENTS

DE   197 01 937 A1   7/1997

(Continued)

*Primary Examiner*—Tesfaldet Bocure
(74) *Attorney, Agent, or Firm*—Dicke, Billig & Czaja, PLLC

(57) ABSTRACT

For synchronising the data transmission between a CMOS circuit (1) and a bipolar circuit (2) a DLL (delayed lock loop) is provided which sets a phase deviation between the operating clocks (CLK1, CLK2) of the two circuits (1, 2), and changes the phase of at least one of the two clocks (CLK1, CLK2) according to this phase deviation, until the two clocks are in phase, in such a way that the data (DATA1) provided by the first circuit (1) can then be taken on by the second circuit (2). To this end, the DLL circuit comprises a phase detector (6), a loop filter (7) and an adjustable element (8).

20 Claims, 1 Drawing Sheet

U.S. PATENT DOCUMENTS

| | | | |
|---|---|---|---|
| 2002/0000856 A1* | 1/2002 | Jung | 327/158 |
| 2003/0001637 A1* | 1/2003 | Jung | 327/158 |
| 2003/0002357 A1* | 1/2003 | Kwon et al. | 365/194 |
| 2003/0067331 A1* | 4/2003 | Drexler | 327/158 |
| 2003/0095009 A1* | 5/2003 | Gomm et al. | 331/57 |
| 2003/0108139 A1* | 6/2003 | Jung | 375/376 |
| 2003/0184355 A1* | 10/2003 | Lee | 327/158 |
| 2006/0188051 A1* | 8/2006 | Donnelly et al. | 375/371 |

FOREIGN PATENT DOCUMENTS

| | | |
|---|---|---|
| EP | 0 379 279 A2 | 7/1990 |
| EP | 0 419 161 A2 | 3/1991 |
| EP | 0 704 975 A1 | 4/1996 |
| EP | 0 810 508 A2 | 12/1997 |

* cited by examiner

METHOD AND DEVICE FOR SYNCHRONIZING DATA TRANSMISSION BETWEEN TWO CIRCUITS

BACKGROUND

The present disclosure relates to a method and a corresponding device for synchronizing the data transmission between two circuits. One embodiment is designed according to different circuit engineering principles, for example CMOS and bipolar circuit engineering.

The interconnection of CMOS (Complementary Metal Oxide Semiconductor) modules and bipolar modules poses major problems, for example in high frequency circuits, since in CMOS circuits, inter alia, the operating time tolerances, due to variations in temperature and supply voltage, are significantly greater than in bipolar circuits. Without the use of a balancing interface, therefore, the synchronization of data and clock between the different circuits would be lost. The abovementioned problem is conventionally solved by so-called elastic-store interfaces, a corresponding example of which is shown in FIG. 1.

FIG. 1 illustrates a CMOS module 1 that writes n-bit-data DATA1 with its CMOS-clock CLK1 in a buffer memory 10, and a bipolar module 2 later reads out or collects the buffered data in the buffer memory 10 with its bipolar clock CLK2 in the form of n-Bit-data DATA2, in order to be able to process this further. At no point in time should a write and a read access be taking place at the same memory cell of the buffer memory 10, since otherwise during a read process the bit stored in the immediately preceding write cycle could be overwritten by the new write cycle. Therefore in the example shown in FIG. 1 offset read and write address counters 11 or 13 are used, so that the undesired overwriting of the memory cells of the buffer memory 10 described above can be reliably avoided. The write addresses generated by the write address counter 11 are stored via a decoder 12 at the individual memory cells of the buffer memory 10, while the read address counter 13 for reading out of the buffered data drives a multiplexer 14. The memory depth of the buffer memory 10, that is, the number of memory cells present, is essentially dependent upon the CMOS tolerances, and the buffer memory 10 can, for example, have a memory depth of 6 (as in the example Illustrated in FIG. 1), 8 or 12.

When such an elastic store interface with circuit components 10-14 is used, the associated space requirement is relative high. In particular, the buffer memory 10, which works according to the FIFO (First In-First Out) principle, is relatively space-intensive and also increases by the power dissipation. All n information channels, usually 8 or 16 bit, must be stored in a correspondingly large memory field of the buffer memory 10 (with a bus width of 16 bits and a memory depth of 6, for example, a total of 96 flip-flops will be needed for this).

SUMMARY

One embodiment provides a method and a corresponding device for synchronizing the data transmission between two circuits, with which the space requirement and the power dissipation can be reduced.

In accordance with one embodiment, the phase of the first clock, with which the data is written from the first circuit to the buffer memory, and the second clock, with which the data is read out from the buffer memory by the second circuit for further processing, is determined and according to this the phase of the first clock and/or the phase of the second clock is/are changed until both clocks are in phase, so that then the data buffered in the buffer memory can be taken on or read out by the second circuit without any problem. In this way, switching time tolerances of the first circuit, which may, for example, be determined by temperature or voltage changes, can be adjusted by adjustable delay elements.

The clock of the second circuit can, for example, be derived from the clock of the first circuit via such controllable delay elements. The clock from the first circuit is then, for example by performing the phase comparison, fed back to the second circuit again. In one embodiment, the delay elements are driven via a loop filter with a periodic characteristic curve, and the loop filter can be designed in the form of an up/down counter. This guarantees that, for signals of the phase detector, which compares both clocks with each other, that point permanently in the same direction, after a certain number of pulses an overrun occurs. Thus, as with a conventional phase locked loop, a phase shift occurs so that any phase deviation between the two clocks can be corrected.

The proposed interface according to the embodiment between the two circuits thus comprises a delay locked loop (or DLL). With the exception of the special design of the loop filter described above, the other components of the control circuit can be built using known circuit components. With a design of the proposed delay stage according to one embodiment or of the proposed control circuit according to one embodiment using digital circuit components the counter position of the loop filter described above can be used directly to drive the respective delay element. Otherwise, a digital-to-analog converter must be provided to drive the delay element between the loop filter and the delay element.

One embodiment is suitable for synchronizing the data transmission between two circuits that have been built using two different types of circuit engineering. Thus, for example, the first circuit can be set up in the form of a CMOS circuit and the second in the form of a bipolar circuit. Of course, the present invention is not, however, restricted to this type of application, but can basically be applied to any circuit combination, also to the combination of two circuits set up using the same circuit engineering.

In accordance with one embodiment only one clock signal needs to be adjusted for synchronizing the data transmission, so that the space requirement and the power dissipation can be limited.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

One embodiment is explained in the following with reference to FIG. 2.

Figure 2:
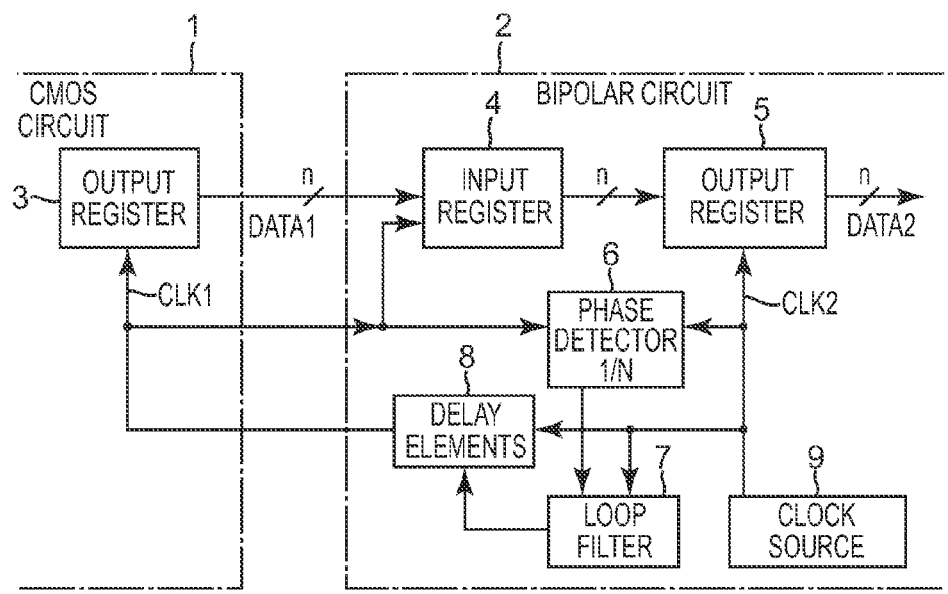
FIG. 2 illustrates a simplified block diagram of a device for synchronizing the data transmission between a CMOS circuit and a bipolar circuit according to one embodiment.

FIG. 2 illustrates a CMOS circuit 1 and a bipolar circuit 2, and the n-bit data DATA1 is to be transmitted from the CMOS circuit 1 to the bipolar circuit 2. The system clock of the CMOS circuit 1 is designated by CLK1 and the system clock of the bipolar circuit 2 by CLK2. The data DATA1 to be transmitted are written by the CMOS circuit 1 via an output register 3 with the clock CLK1 in an input register 4, which functions as a buffer memory and is present in the bipolar circuit 2. The data buffered in the input register 4 is read out by the bipolar circuit 2 with the clock CLK2 via an output register 5 and made available in the form of n-bit data DATA2 for further processing. As can be seen from FIG. 2, the clock CLK1 of the CMOS circuit 1 is derived via one or more controllable delay elements 8 from the clock CLK2 of the bipolar circuit 2, and the clock CLK2 is made available from a clock source 9.

The operating time tolerances of the CMOS circuit 1, which can be determined by temperature and voltage changes, are adjusted with the help of the abovementioned adjustable delay elements 8. For this purpose, the primary system clock in the bipolar circuit is fed back again into the bipolar circuit 2 via the CMOS circuit 1, and a phase detector compares the original clock, that is, the clock CLK2, and the returning clock, that is, the clock CLK1, with each other for their phase. The output signal from the phase detector 6, which is dependent upon the phase of the two clocks CLK1 and CLK2 or the result of the comparison, drives via a loop filter 7. The output of loop filter 7 feeds delay element 8 and a delay is created by the delay element 8 until both clocks CLK1 and CLK2 are in phase. The output register 5 of the bipolar circuit 2 can then take the data buffered in the input register 4 without problems and output for further processing.

In a conventional phase control circuit, two clock signals are continuously compared with each other and the control range of the phase, because the periodic repetition of the behavior is a maximum of 360°. The phase relationships between the two clocks are repeated even for an infinite control range of the loop filter implemented in each case.

The delay element 8, however, has only a limited range, which can be used for correction of phase deviations between the two clocks CLK1 and CLK2. When the circuit arrangement illustrated in FIG. 2 is switched on, however, the behavior of the CMOS circuit 1 is unknown. Accordingly, the phase delay of the CMOS circuit 1 according to the respective temperature may be large or small. In addition, the case may arise where the phase delay of the CMOS circuit 1 has to be reduced by the delay element 8 and, however, the delay element 8 when the circuit arrangement is switched on is already set to its lowest value, so that a correction of the phase displacement between the two clocks CLK1 and CLK2 would be impossible.

In order to remove this problem, the loop filter 7 in one embodiment has a periodic characteristics curve and can be set up as a up/down counter, which is driven by a corresponding up/down counter signal of the phase detector 6. With such a configuration of the loop filter 7, for signals of the phase detector 6 that permanently point in the same direction, after a certain number of pulses an overrun occurs and thus a phase shift as in a conventional phase control circuit.

The temperature- and voltage-dependent delay of the CMOS circuit 1 can in some circumstances comprise a number of clock periods. To this end, when the circuit arrangement illustrated in FIG. 2 is switched on an initialization routine is followed, with the help of which the instantaneous delay of the CMOS circuit can be determined. In addition, the phase detector 6 compares the clocks CLK1 and CLK2 that have been broken down evenly with regard to their frequency by a divider factor N and changes the delay of the delay element 8 until the phase detector 6 detects a correspondence between the broken down clock CLK1 and CLK2. Here, the divider factor N is determined by the maximum expected delay and is selected as follows:

$$N > (\text{maximum delay/clock period of } CLK2) + 1$$

Only when correspondence is detected, regarding the clock CLK1, CLK2 broken down by the divider factor N, by the phase detector 6 are the original (undivided) clocks CLK1 and CLK2 applied to the phase detector 6.

In this way, the delay of the delay element 8 following evaluation of the broken down clocks CLK1, CLK2 is set at a value that is large enough to adjust the delay between the undivided clocks CLK1, CLK2 even without phase shift.

Figure 1:
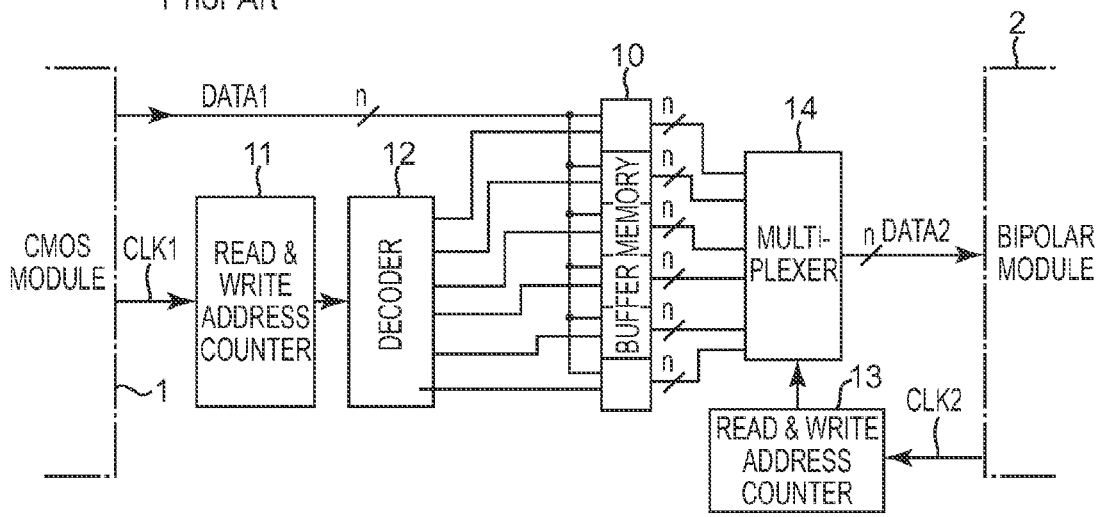
FIG. 1 illustrates a simplified block diagram of an elastic store interface for synchronizing the data transmission between a CMOS circuit and a bipolar circuit according to the prior art.

The above description of the embodiment illustrated in FIG. 2 clearly shows that unlike the conventional example illustrated in FIG. 1, just one signal, namely the clock CLK1, has to be adjusted for synchronizing the data transmission between the CMOS circuit 1 and the bipolar circuit 2. With the circuit arrangement illustrated in FIG. 1, on the other hand, all information channels, normally 8- or 16-bit, must be stored in a correspondingly large memory field of the respective buffer memory, so that through the described embodiment the space requirement and the power dissipation can be significantly reduced.

The invention claimed is:

1. A method for synchronizing data transmission from a transmit circuit to a receive circuit, comprising:
   in response to a first clock, the transmit circuit writing data into a buffer memory; in response to a second clock, the receive circuit reading the data from the buffer memory for further processing of the data;
   comparing the first clock and second clocks;
   in response to said comparing step, changing a phase relationship between the first and second clocks so that the first and second clocks are in phase with one another during said reading step, including adjusting an adjustable delay element to put the first and second clocks in phase with one another;
   before said step of comparing the first and second clocks, comparing a divided version of the first clock to a divided version of the second clock and, in response to said step of comparing said divided versions of the first and second clocks, adjusting the adjustable delay element to put the divided versions of the first and second clocks in phase with one another.

2. The method of claim 1, including deriving the first clock from the second clock, and providing the first clock to the receive circuit for at least one of said comparing steps.

3. The method of claim 1, wherein said adjusting step includes using a loop filter which has a periodic characteristic curve.

4. The method of claim 3, wherein said step of using a loop filter includes driving an up/down counter with an up/down count signal.

5. The method of claim 1, including identifying a maximum delay between the second clock and the first clock, defining a first value that is greater by 1 than a ratio of the maximum delay to a period of the second clock, selecting a divisor value that is greater than the first value, and using the divisor value to produce the divided versions of the first and second clocks.

6. The method of claim 1, wherein the transmit circuit is one of a CMOS circuit and a bipolar circuit, and the receive circuit is the other of a CMOS circuit and a bipolar circuit.

7. An apparatus for synchronizing data transmission from a transmit circuit to a receive circuit, comprising:
- a buffer memory for storing data written thereto by a transmit circuit operating in response to a first clock, said buffer memory further for permitting the stored data to be read therefrom by the receive circuit operating in response to a second clock;
- a phase detector for detecting a first phase relationship between the first and second clocks;
- an adjustable delay element coupled to the phase detector and responsive to the first phase relationship for changing the first phase relationship so that the first and second clocks are in phase with one another when the data is read from the buffer memory; and
- the phase detector further operable for detecting a second phase relationship between a divided version of the first clock and a divided version of the second clock and, before changing the first phase relationship, the adjustable delay element responsive to the second phase relationship for changing the second phase relationship to put the divided versions of the first and second clocks in phase with one another.

8. The apparatus of claim 7, wherein the adjustable delay element is further for deriving the first clock from the second clock.

9. The apparatus of claim 8, wherein the phase detector and the adjustable delay element are included in the receive circuit, and wherein the phase detector includes an input for receiving the first clock from the transmit circuit.

10. The apparatus of claim 7, including a loop filter coupled between the adjustable delay element and the phase detector, the adjustable delay element driven by the phase detector via the loop filter.

11. The apparatus of claim 10, wherein the phase detector provides an output signal indicative of one of the phase relationships, wherein the loop filter is for generating a loop filter output signal for setting a delay of the adjustable delay element, and wherein the loop filter has a periodic characteristic curve with regard to the phase detector output signal and the loop filter output signal.

12. The apparatus of claim 10, wherein the loop filter includes an up/down counter, and the phase detector provides an output signal indicative of one of the phase relationships, and wherein the phase detector output signal is an up/down signal for driving the up/down counter.

13. The apparatus of claim 7, wherein the transmit circuit is one of a CMOS circuit and a bipolar circuit, and the receive circuit is the other of a CMOS circuit and a bipolar circuit.

14. A device for synchronizing data transmission between first and second circuits comprising:
- a first clock signal;
- a second clock signal;
- a buffer memory into which data is written by the first circuit in accordance with the first clock signal and out of which data is read by the second circuit in accordance with the second clock signal;
- a phase detector for comparing the phase of the first clock signal with the phase of the second clock signal; and
- an adjustable delay element responsive to the phase detector such that the phase of the first clock signal is changed according to the comparison made by the phase detector.

15. The device of claim 14, wherein the first clock signal is derived from the adjustable delay element and from the second clock signal.

16. The device of claim 15, wherein the phase detector and the adjustable delay element are in the second circuit and the first clock signal is in the first circuit and sent to the phase detector.

17. The device of claim 14, wherein the adjustable delay element is driven via a loop filter by the phase detector.

18. The device of claim 17, wherein the phase detector provides an output signal indicative of one of the phase relationships, wherein the loop filter is for generating a loop filter output signal for setting a delay of the adjustable delay element, and wherein the loop filter has a periodic characteristic curve with regard to the phase detector output signal and the loop filter output signal.

19. The device of claim 17, wherein the loop filter includes an up/down counter, and the phase detector provides an output signal indicative of one of the phase relationships, and wherein the phase detector output signal is an up/down signal for driving the up/down counter.

20. The device of claim 14, wherein the first circuit includes one or a CMOS circuit and a bipolar circuit and the second circuit includes the other of a CMOS circuit and a bipolar circuit.

* * * * *